(12) United States Patent
Takizawa et al.

(10) Patent No.: US 6,787,805 B1
(45) Date of Patent: Sep. 7, 2004

(54) SEMICONDUCTOR DEVICE AND MANUFACTURING METHOD

(75) Inventors: Teruo Takizawa, Suwa (JP); Hiroyuki Shimada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/763,365

(22) PCT Filed: Jun. 16, 2000

(86) PCT No.: PCT/JP00/03968

§ 371 (c)(1),
(2), (4) Date: Feb. 23, 2001

(87) PCT Pub. No.: WO00/79601

PCT Pub. Date: Dec. 28, 2000

(30) Foreign Application Priority Data

Jun. 23, 1999 (JP) .......................................... 11-177078

(51) Int. Cl.[7] .......................... H01L 29/04; H01L 31/117
(52) U.S. Cl. ............................. 257/63; 257/65; 257/616
(58) Field of Search ............................. 357/23.4, 23.1, 357/59, 61; 257/370, 191, 192, 197, 66, 57, 59, 347, 762, 288, 616

(56) References Cited

U.S. PATENT DOCUMENTS

| 5,101,247 A | * | 3/1992 | Ozturk et al. ............... 257/288 |
| 5,216,271 A | * | 6/1993 | Takagi et al. ............... 257/191 |
| 5,227,333 A | * | 7/1993 | Shepard ............... 148/DIG. 58 |
| 5,608,249 A | * | 3/1997 | Gonzalez ................... 257/304 |
| 5,801,444 A | * | 9/1998 | Aboelfotoh et al. ........ 257/742 |
| 6,124,614 A | * | 9/2000 | Ryum et al. ................ 257/347 |

FOREIGN PATENT DOCUMENTS

| JP | 48-22022 B1 | | 7/1973 | |
| JP | 63-198373 A | | 8/1988 | |
| JP | 5-235335 | | 9/1993 | |
| JP | 7-202178 A | | 8/1995 | |
| JP | 7-288323 A | | 10/1995 | |
| JP | 10-27854 A | | 1/1998 | |
| JP | 10-27854 | * | 1/1998 | ....... H01L/21/8238 |
| JP | 11-3999 A | | 1/1999 | |
| JP | 11-17182 A | | 1/1999 | |
| JP | 11-87708 A | | 3/1999 | |
| JP | 11-162916 A | | 6/1999 | |
| WO | WO 94/14198 A | | 6/1994 | |

OTHER PUBLICATIONS

Quirk et al., Semiconductor Manufacturing Technology (2001), Prentice Hall, pp. 309–311.*

Hwang et al., Novel Polysilicon stacked–Gate Structure for Fully–Depleted SOI/CMOS (1992 IEEE).

King et al., A Polycrystalline–$Si_{1-x}Ge_x$–Gate CMOS Technology (1990 IEEE).

* cited by examiner

Primary Examiner—Carl Whitehead, Jr.
Assistant Examiner—David L. Hogans
(74) Attorney, Agent, or Firm—Oliff & Berridge, PLC

(57) ABSTRACT

A semiconductor device comprising a metal-oxide-semiconductor field-effect transistor well controllably brings the work function of a gate electrode close to the intrinsic mid gap energy of silicon, thereby lowering the concentration of impurities in a channel. By this, the deterioration of carrier mobility is prevented and a metal-oxide-semiconductor field-effect transistor is obtained. A gate electrode has a multi-layer structure of a p-type polycrystalline or a single-crystalline germanium film 3 and a low resistance conductive film 4.

5 Claims, 9 Drawing Sheets (a)

(b)

(c)

(d)

SEMICONDUCTOR DEVICE AND MANUFACTURING METHOD

FIELD OF THE INVENTION

The present invention relates to a semiconductor device and a manufacturing method thereof, which are favorably fitted to a metal-oxide-semiconductor field-effect transistor.

BACKGROUND OF THE INVENTION

In a metal-oxide-semiconductor field-effect transistor (hereinafter also referred to as "MOSFET") used in a conventional semiconductor device, a polysilicon film in which impurities are deeply doped is used as a material for a gate electrode. For example, in a manufacturing process technique used in manufacturing a CMOS circuit (Complimentary MOSFET circuit), in order to balance the performance characteristic of the circuit, n-type polysilicon, in the case of n-channel MOSFET (NMOS), and p-type polysilicon, in the case of p-channel MOSFET (PMOS) are used as a material for a gate electrode. Further, for the purpose of lowering the resistance of a gate electrode, a structure to form a transition metal silicide film on the surface of the gate electrode is used.

In this case, however, the work function of an n-type polysilicon film is 4.15 eV and that of a p-type polysilicon film is 5.25 eV, which results in a value largely deviating from the intrinsic mid gap energy of silicon, 4.61 eV. Such large deviation of the value causes an increase in the absolute value of the flat-band voltage $V_{F2}$ upon considering a MOS capacitor consisting of a laminated structure of a metal, an insulated film and a semiconductor (Signs are different between NMOS and PMOS). Thus, an optimum value * of impurity concentration in the MOSFET channel for controlling the threshold value $V_{th}$ is shifted close to the value of high concentration.

In such channel of high concentration, scattering by impurities has a large influence, which invites the deterioration of carrier mobility in the channel. Namely, this indicates the deterioration of the current driving ability of MOSFET and gives a material influence on the response characteristic of the circuit.

In order to solve such problem, various gate electrode materials having a work function are being suggested. "Tsu-Jae King and others" (IEDM Technical Digest 1990, page 253) and Japanese Patent Laid-Open Publication Hei 5-235335, for example, suggest a structure using an SiGe alloy film as a material for a gate electrode, and "Jeong-Mo Hwang and other"(IEMD Technical Digest 1992, page 345) suggests a structure using a TiN film.

FIG. 8 indicates the first example of related arts using an SiGe alloy film for a gate electrode. Explaining FIG. 8, it indicates a structure in which an NMOS transistor 20 and a PMOS transistor 21 are formed on a substrate 1, and an n-type polycrystalline SiGe film 30 and a p-type polycrystalline SiGe film 31 are respectively deposited on a gate oxide 2. Further, a low resistance conductive film for lowering the resistance is provided on the SiGe film 30. Upon using such SiGe alloys as a gate electrode material, a work function can be shifted closer to the intrinsic aid gap energy of silicon in the proportion of germanium atoms contained in the silicon.

Further, Reference no. 5 indicates a source and drain region, Reference no. 22 an n-well region and Reference No. 23 an element separation oxide.

In the aforementioned related art example, however, a substantial improvement of characteristics can only be expected in the PMOS transistor 21. This derives from a physical phenomenon that changes in a band structure in SiGe alloy can be mainly recognized only in the valence band side. That is, the work function of the p-type polycrystalline SiGe film 31 can be controlled by mixing germanium, however, the n-type polycrystalline SiGe film 30 is no more effective than expected.

FIG. 9 indicates an example of related arts using a TiN film for a gate electrode. In FIG. 9, the components identical to those in FIG. 8, are donated by the same reference numerals and the detailed explanation thereof is abbreviated. As in FIG. 8, FIG. 9 indicates a structure in which the NMOS transistor 20 and the PMOS transistor 21 are formed on a substrate 1, and a TiN film 32 is formed on the gate oxide 2. Further, the low resistance conductive film 4 is also provided on the TiN film 32 as provided in the first related art example.

This work function of such TiN film as described in "Jeong Mo Hwang and others" (IEDM Technical Digest 1992, page 345), is 4.7 to 4.8 eV, which is close to the intrinsic mid gap energy of silicon, 4.61 eV, and is more effective.

In this case, however, as the work function of a gate electrode is uniquely determined, there is a problem that a little unbalance arises as to the characteristics of the NMOS transistor and the PMOS transistor. Further upon adopting the aforementioned low resistance conductive film 4, the dispersion in work functions is caused by a conductive film formation process, therefore, there is also a drawback that the process conditions should be strictly controlled.

DESCRIPTION OF THE INVENTION

The present invention is made in view of the above problems, and prevents the deterioration of carrier mobility in a channel in a semiconductor, especially an NMOS transistor and a PMOS transistor, and provides a semiconductor device having a high current driving ability and a manufacturing method thereof.

In order to solve this problem, the present invention, in a metal-oxide-semiconductor field-effect transistor formed on a silicon substrate, provides a semiconductor device in which a gate electrode of such transistor is formed with a germanium film.

The germanium film can be a single-crystalline germanium film, a polycrystalline germanium film or an amorphous germanium film. Further, p-type impurities can be doped into the germanium film.

The gate electrode can comprise a multi-layer structure which includes a germanium film and a low resistance conductive film.

Further, the low resistance conductive film can include a transition metal, a transition metal silicide or a transition metal nitride film, or a combination thereof.

Such multi-layer structure can also be provided with a polysilicon film in between a germanium film and a low resistance conductive film.

The present invention provides a semiconductor device having an n-channel metal-oxide-semiconductor field-effect transistor and a p-channel metal-oxide-semiconductor field-effect transistor which complement each other, wherein a gate electrode of each of the transistors comprises a single-crystalline germanium film, a polycrystalline germanium film or an amorphous germanium film in which p-type impurities are doped.

The present invention also provides a manufacturing method of a semiconductor device comprising a step of forming a gate oxide on a semiconductor substrate; a step of forming a germanium film on the gate oxide; a step of doping p-type impurities into the germanium fill and then patterning such germanium film to form a gate electrode and a step of forming a source and drain region by using the gate electrode as a mask.

The step of forming the gate electrode can comprise a step of forming a polysilicon film on the germanium film, a step of forming a transition metal on the polysilicon film and a step of annealing the polysilicon so that a part or all of such polysilicon becomes a transition metal silicide.

The step of forming the gate electrode can include a step of forming a metal transition film or a metal transition nitride film on the germanium film.

The step of doping the p-type impurities can be used by a CVD method.

Furthers the step of doping the p-type impurities is used by an ion implantation method.

Furthermore, the present invention provides a manufacturing method of a semiconductor device comprising a step of forming a gate oxide on a semiconductor substrate, a step of forming a germanium film on the gate oxide, a step of doping p-type impurities into the germanium film and patterning such germanium film to form a gate electrode, a step of forming a source and drain region by using the gate electrode as a mask, a step of forming a spacer on both ends of the gate electrode, and a step of forming a transition metal film on the gate electrode and the source and drain region and a step of annealing the transition metal to form a transition metal silicide.

PREFERRED EMBODIMENT OF THE INVENTION

Next, embodiments of the present invention are explained in reference to the drawings.

Figure 1:
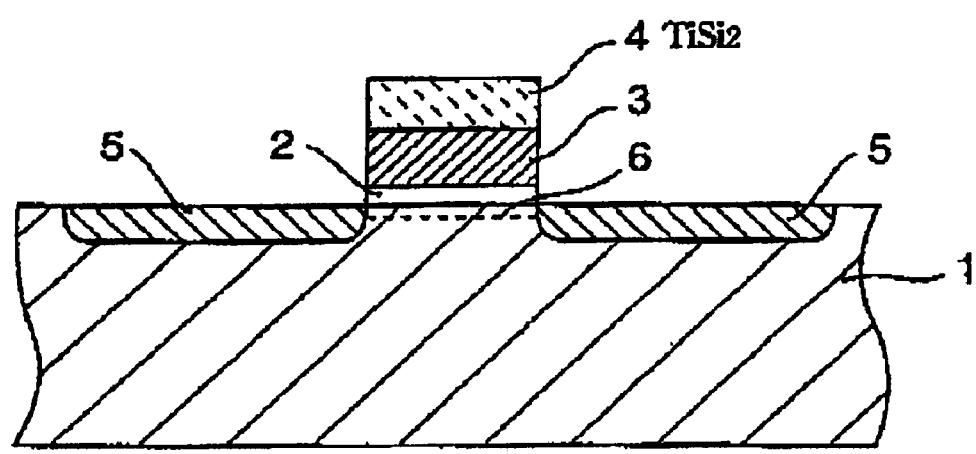
FIG. 1 is a sectional view showing the first embodiment of the present invention.

The first embodiment of the present invention is shown in FIG. 1. FIG. 1 in a diagram of the case in which the present invention is applied to a p-channel MOSFET.

In a semiconductor relating to the first embodiment of the present invention, the polycrystalline germanium film 3 and the low resistance conductive film 4 are formed through the gate oxide 2 in a region of the p-type silicon substrate 1 where a gate electrode is formed. The germanium film 3 may be a single-crystalline germanium or an amorphous germanium film in addition to a polycrystalline germanium layer. A germanium film, however, has a characteristic of a p-type semiconductor by doping p-type impurities, e.g. boron (B). Further, immediately below the gate oxide 2, a channel part 6 is provided and at both ends thereof a source and drain region 5 is provided, thereby forming a MOSFET. Thus, in this embodiment, the use of a germanium film as a gate electrode can suppress the concentration raising of impurities doped in a channel and can prevent the deterioration of carrier mobility in a channel.

Figure 2:
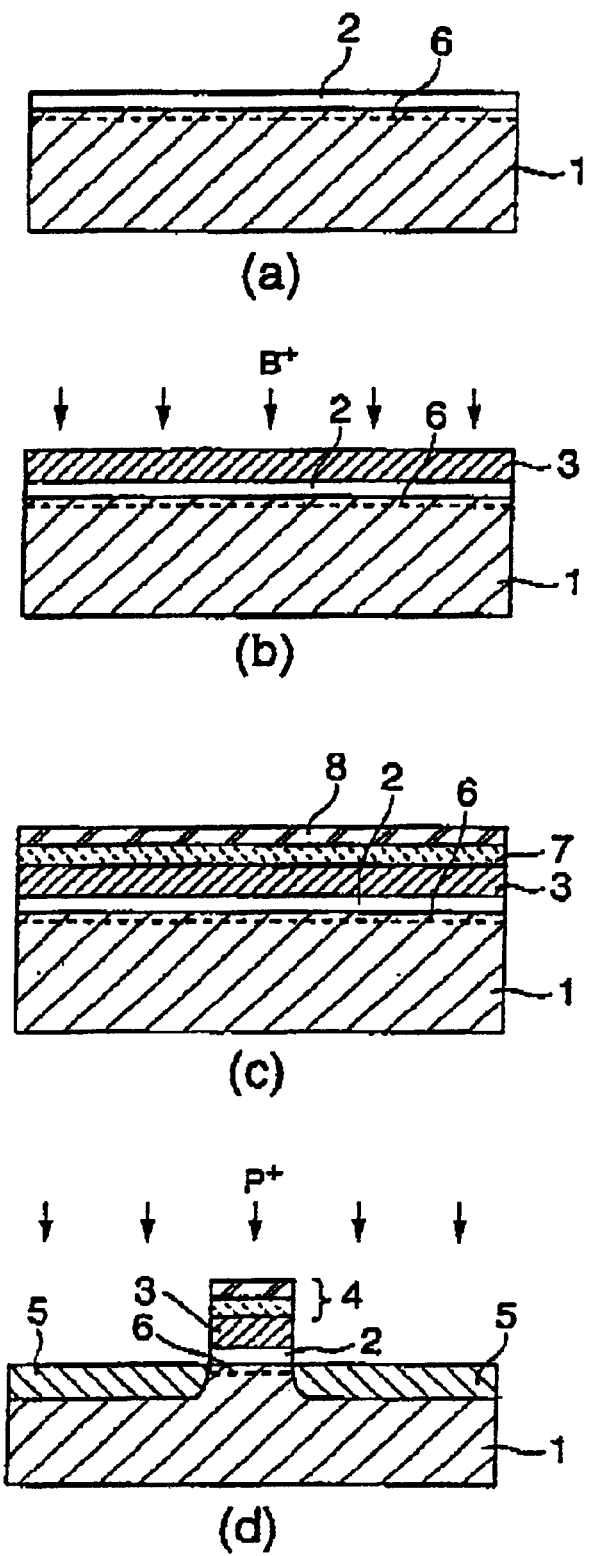
FIG. 2 is a diagram explaining a first manufacturing method relating to the first embodiment of the present invention.
Figure 3:
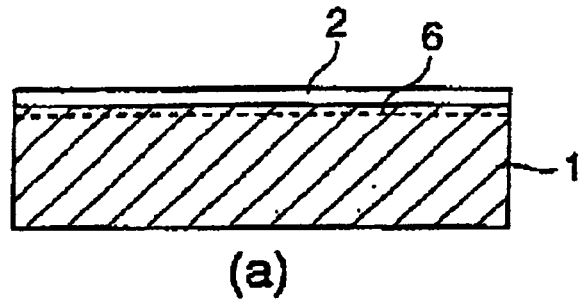
FIG. 3 is a diagram explaining a second manufacturing method relating to the first embodiment of the present invention.
Figure 3:
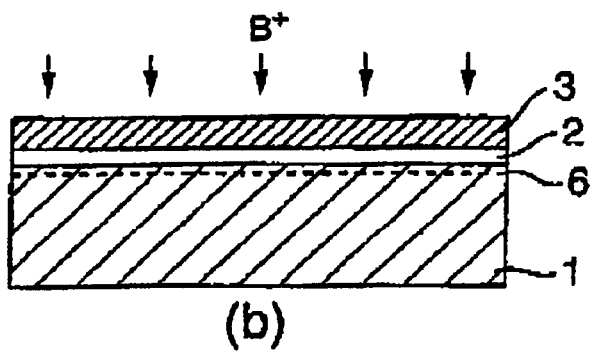
Figure 3:
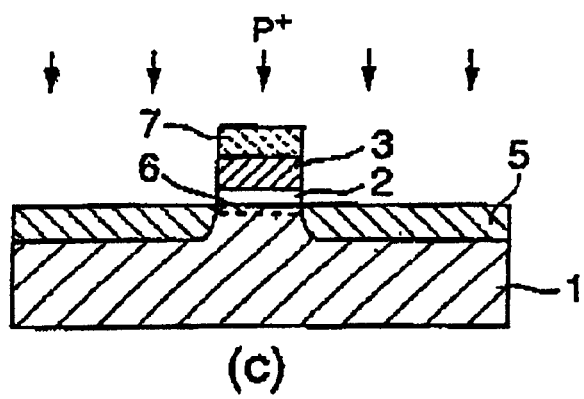
Figure 3:
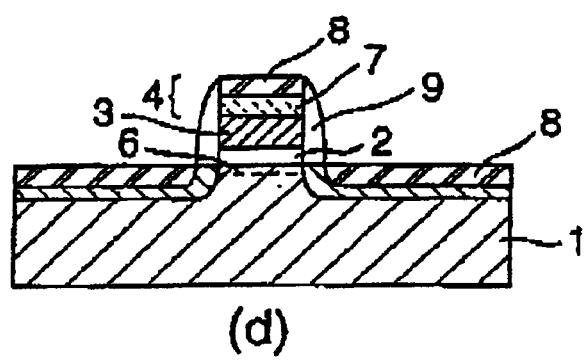

Next, a manufacturing method of the present invention is explained in reference to FIG. 2 and FIG. 3. In the following, however, an NMOS transistor is explained, but a PMOS transistor can also be manufactured in the same way by suitably changing the impurities to be doped to the channel part 6 and the source and drain region 5.

FIG. 2 shows a first manufacturing method relating to this embodiment.

In FIG. 2(a), after borons (B$^+$) are first doped into a p-type silicon substrate 1 having a specific resistance of 14 to 22 Ω/cm and the surface orientation (100) to obtain a region with a low concentration of $10^{15}$ to $10^{17}$ cm$^{-3}$ and to form the channel 6, approximately 70 to 100 angstroms of a gate electrode is formed with thermal oxidation.

Next, in FIG. 2(b), 200 to 400 nm the polycrystalline germanium film 3 is deposited by a CVD (chemical Vapor Deposition) method and borons (B$^+$) are doped into such film by an ion implantation method to obtain a region with a concentration of approximately $10^{17}$ to $10^{20}$ cm$^{-3}$. The details on the concentration of borons to be doped into the polycrystalline germanium film 3 at this time is described later.

Next, in FIG. 2(C), after a polysilicon film 7 is deposited on the aforementioned polycrystalline germanium film 3 by a CVD method, a transition metal film e.g. a Ti film is formed by a spattering method, and a part of the polysilicon film 7 becomes a transition metal silicide film 8 (TiSi$_2$ film) through a high temperature annealing. Further, at this time, all of the polysilicon film 7 can become a refractory silicide. Furthermore, Co, Mo, etc. can be cited as examples of transition metals, in addition to Ti.

Finally in FIG. 2(d), after applying a resist not shown in the figure and patterning a gate electrode by a photo lithography, phosphoruses (P+) are doped using this gate electrode pattern as a mask to obtain a region with a concentration of approximately $10^{20}$ cm$^{-3}$. Consequently, the source and drain region 5 is obtained by self-alignment.

Next, a second manufacturing method relating to this embodiment is explained in reference to FIG. 3. Further, the components identical to those in FIG. 2 are donated by the same numerals and the detailed explanation thereof are abbreviated.

First, in FIG. 3(a), as in the first manufacturing method shown in FIG. 2(a), the channel part 6 is formed on the p-type silicon substrate 1 having a specific resistance of 14 to 22 Ω/cm and the surface orientation (100), and approximately 70 to 100 angstrom of a gate electrode is formed with thermal oxidation.

Next in FIG. 3(b), the polycrystalline germanium film 3 is deposited on the gate oxide 2 and barons (B+) are doped to become a p-type semiconductor by an ion implantation method.

Next, in FIG. 3(c), after depositing the polysilicon film 7 by a CVD method, a resist not shown in the figure is applied and a gate electrode is patterned by a photo lithography method. Using this gate electrode pattern, the source and drain region 5 is formed by self-alignment. The process of up to here is the same as that in the first manufacturing method of FIG. 2. Next, after silicon dioxide spacers 9 are formed at both ends of the gate electrode, a transition metal film, e.g. a Ti film, Co film or No film is formed by a spattering method and a part of the polysilicon film 7 and a surface of the source and drain region 5 becomes the transition metal silicide film 8 through a high temperature annealing. In this manufacturing method, however, au phosphoruses (P+) are doped in the formation of the source and drain 5 into the polysilicon film 7 to form an n-type semiconductor, a p-n junction is generated between this and the polycrystalline germanium film. Accordingly, when using this second manufacturing method, in order to prevent such p-n junction from being generated, it is better that all of the polysilicon film 7 becomes a transition metal silicide.

As explained above, according to the manufacturing method in the embodiment of the present invention, it is possible to bring a work function of a gate electrode close to an intrinsic mid gap energy of silicon, therefore, the concentration raising of impurities doped in a channel can be suppressed, thereby enabling the prevention of deterioration of carrier mobility in the channel.

Here, a work function control of a gate electrode in the present invention is explained.

Figure 4:
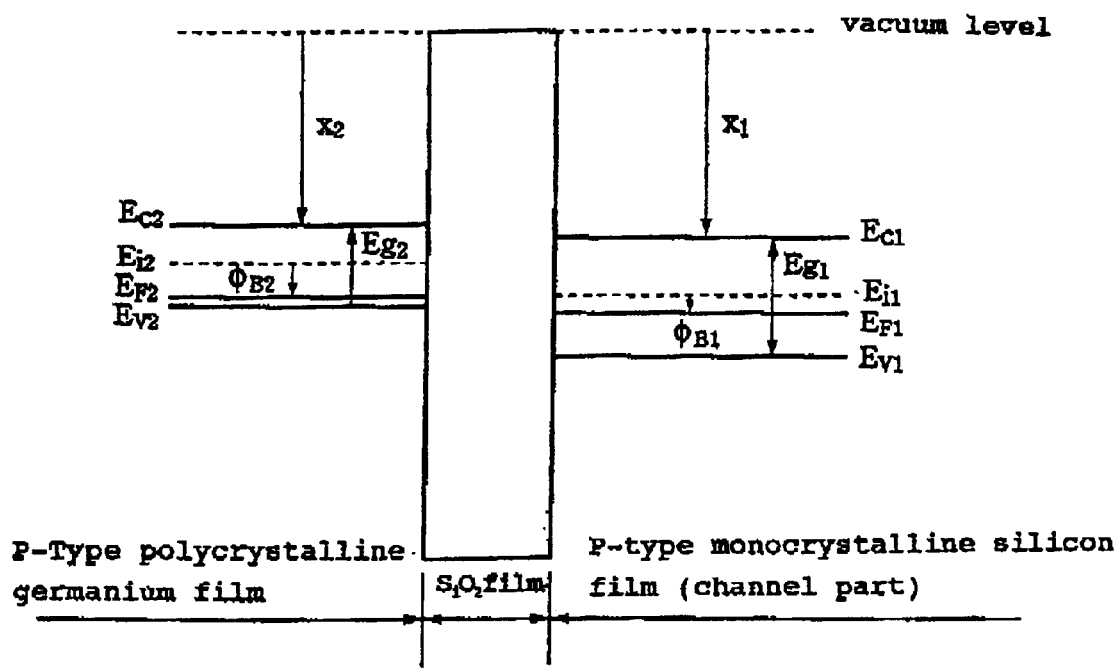
FIG. 4 is a diagram showing an energy band diagram in an MOS structure of the present invention.

FIG. 4 is an energy band diagram of a MOS structure manufactured on the basis of the aforementioned first or second manufacturing method.

An electron affinity energy $\chi_1$ of a p-type single-crystalline silicon film (channel part) is 4.05 eV, an energy gap $E_{g1}$ is 1.12 eV, and the intrinsic mid gap energy is 4.61 eV. Meanwhile, an electron affinity energy $\chi_2$ is 4.0 eV, an energy gap $E_{g2}$ is 0.66 eV, and an intrinsic mid gap energy $E_{g2}$ is 4.33 eV. When impurities are deeply doped into this polycrystalline germanium film to be p-type, a work function $\phi_m$ can be shown in the following formula (1).

$$\phi_m = \chi_2 + E_{g2}/2q + \phi_{B2} = E_{i2} + (K_B T/q) \ln (Na/ni) \qquad (1)$$

Here, $K_B$ indicates Boltzman's constant, T indicates absolute temperature, q indicates quantum of electric charge, ni indicates an intrinsic carrier concentration of germanium, and Na indicates an impurity concentration doped into a polycrystalline germanium film.

Upon bringing $\phi_N$ close to 4.61 eV in a greenhouse (T=300K), for example, the required impurity concentration Na can be found as $1.2 \times 10^{13}$ cm$^{-3}$ using the intrinsic carrier concentration of germanium of ni; $2.4 \times 10^{13}$ cm$^{-2}$. At this time, the condition of an ion implantation is that the $B_+$implantation energy is 50 keV and the doze amount is approximately 1.0 m$\times 10^{13}$ cm$^{-2}$ cm$^{-2}$ per a 300 nm polycrystalline germanium film thickness. Further, even if the doze amount varies within the extent of ±30%, the variation of the work function $\phi_M$ is no more than 0.01 V according to the formula (1), which shows the high controllability of the work function.

Further, when a material close to an intrinsic aid gap energy of Si is used as a gate electrode, an electrode of the same material can be used for an n-channel type transistor and a p-channel type transistor, but if any deviation of the work function of a Ti film $\phi_M$ from the intrinsic mid gap energy of Si causes a difference in a channel dope amount between the n-channel transistor and the p-channel transistor, thereby arising an unbalanced aspect in characteristic. Meanwhile, when a p-type polycrystalline germanium is used for a gate electrode, it is possible to bring such energy close to the intrinsic mid gap energy of Si by using polycrystalline germanium deeply doped to be n+ type. By this, a CMOS well-balanced in the characteristic, in which an electrode of the same material is used, can be obtained.

Regarding the doping process of p-type impurities in the first manufacturing method and the second manufacturing method relating to the first embodiment of the present invention, only those by an ion implantation method is mainly explained in the above, but in place of such ion implantation method, the p-type polycrystalline germanium fill 3 say also be formed by a CVD method using a mixed gas of GeH$_4$ and B$_2$H$_6$. This case brings an advantage that an ion plantation process and an impurity thermal diffusion process required subsequent to such ion implantation process can be omitted.

Figure 5:
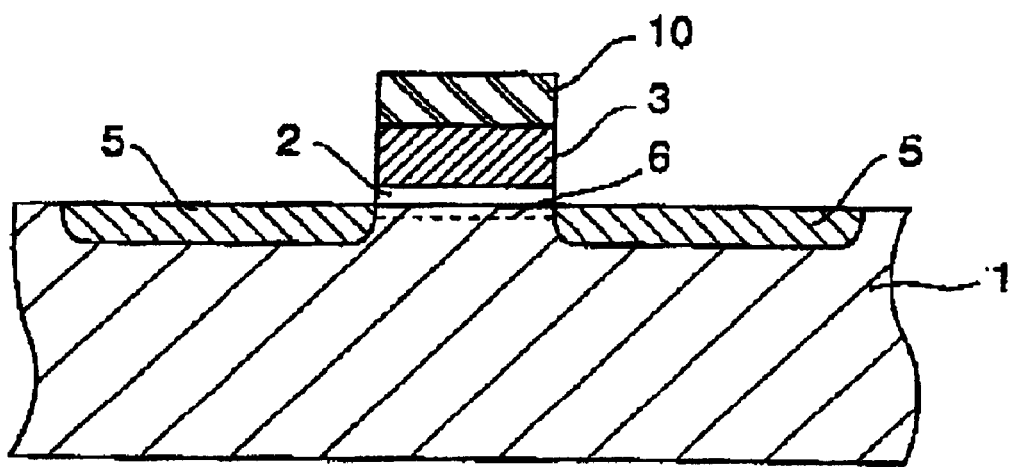
FIG. 5 is a sectional view showing the second embodiment of the present invention.

Next, the second embodiment of the present invention is explained in reference to FIG. 5. Further, the components identical to those in the aforementioned first embodiment are donated by the same numerals.

In a semiconductor device relating to the second embodiment of the present invention, the polycrystalline germanium film 3 is formed through the gate oxide 2 in the region of the p-type silicon substrate 1 where a gate electrode is formed. On the p-type polycrystalline germanium film 3, a transition metal film 10 is directly formed as a low resistance conductive film by a spattering method. For this transition metal, Mo, etc., which is chemically stable and has a lower specific resistance among the transition metals, is desirable. Thus, in the case of directly forming a transition metal on the p-type polycrystalline germanium film 3, high temperature annealing is not required. Therefore, this solves a problem that the impurities doped on the p-type polycrystalline germanium film 3 are penetrated into the gate oxide 2.

Especially in a very thin gate oxide (no more than 3 nm), this embodiment can be an effective means. Further, Reference no. 5 indicates a source and drain region and Reference no. 6 indicates a channel part.

Figure 6:
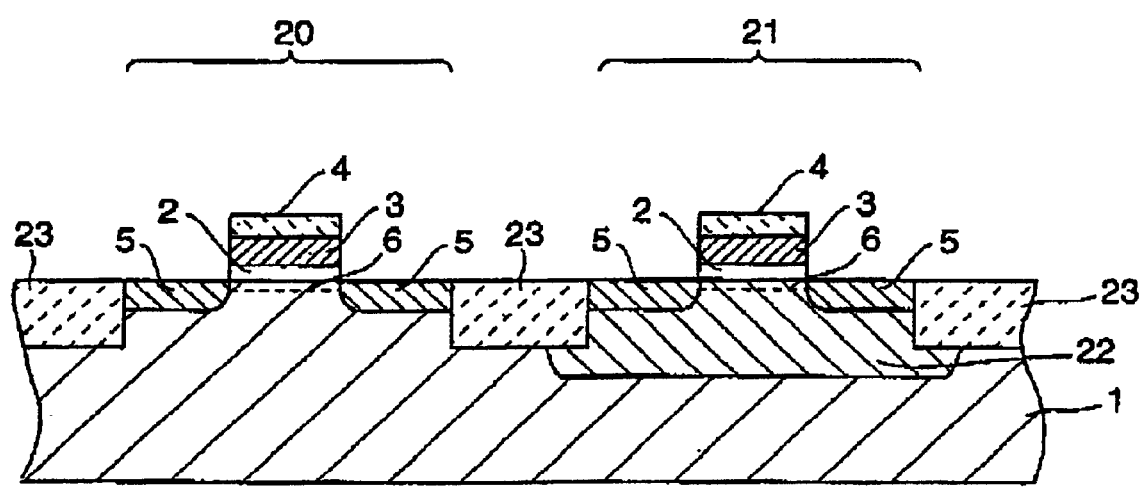
FIG. 6 is a sectional view showing the third embodiment of the present invention.
Figure 8:
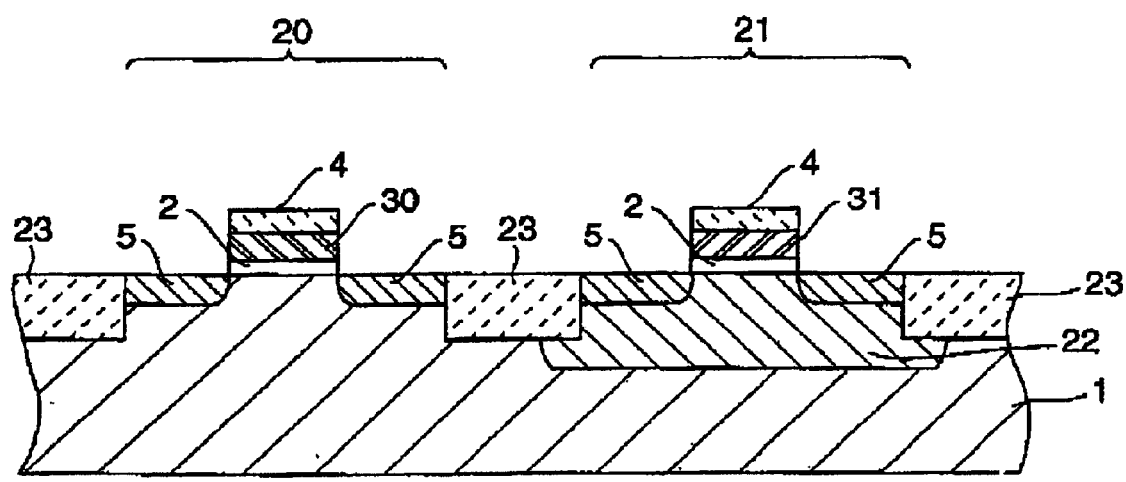
FIG. 8 is a diagram showing an example of a related art.
Figure 9:
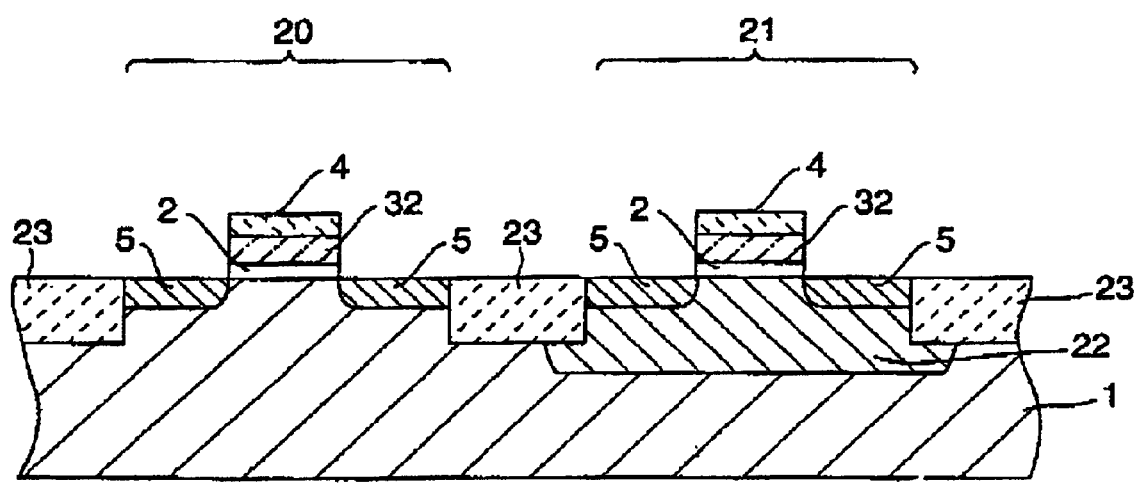
FIG. 9 is a diagram showing an example of a related art.

Next, the third embodiment of the present invention is explained in reference to FIG. 6. Further, the components identical to those in the aforementioned conventional example of FIG. 8 are donated by the same numerals.

FIG. 6 indicates a structure in which the PMOS transistor 21 and the NMOS transistor 20 are formed on the p-type silicon substrate 1, and in the region of the PMOS transistor 21 on the p-type silicon substrate 1, an n-well region 22 is formed and is separated from the NMOS transistor 20 through an element separation oxide 23. In both the NMOS transistor and the PROS transistor, 200 to 400 nm of the polycrystalline germanium film 3 is deposited on the gate insulation film 2 by a CVD (Chemical Vapor Deposition) method, and borons (B$_+$) are deeply doped into such films by an ion implantation method to obtain a region with a concentration of approximately $10^{17}$ to $10^{20}$ cm$^{-3}$. By this, the work function of the p-type polycrystalline germanium film 3 is brought close to the intrinsic mid gap energy. Accordingly, no difference arises as to the concentration of the impurities doped in the channel parts of the NMOS and the PMOS, therefore, a well-balanced CMOS characteristic is obtained. Further, Reference no. 4 indicates a low resistance conductive film, Reference no. 5 a source and drain region and Reference no. 6 a channel part.

Figure 7:
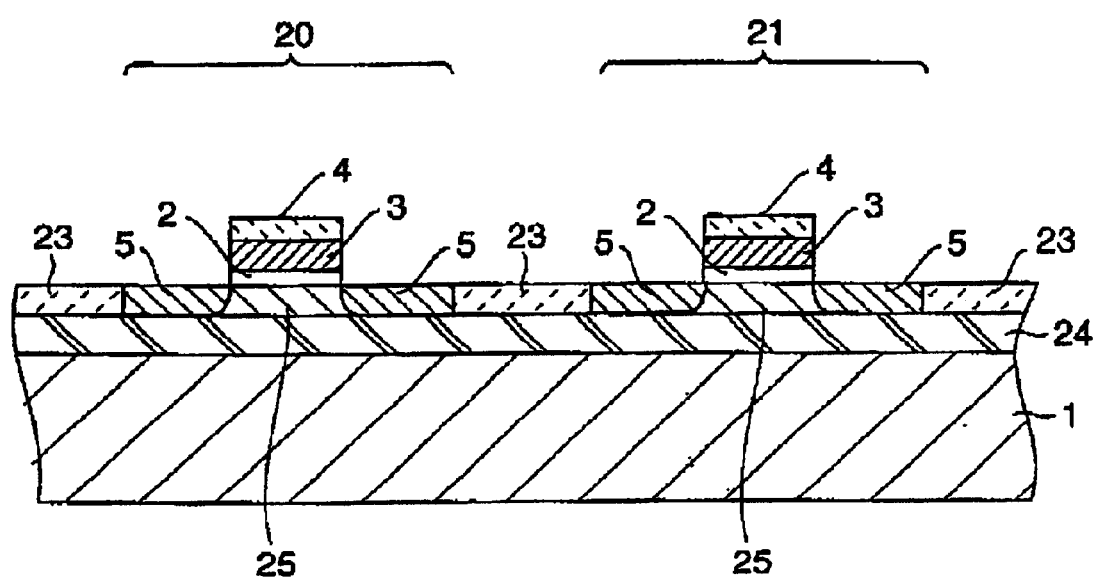
FIG. 7 to a sectional view showing the fourth embodiment of the present invention.

Next, the fourth embodiment of the present invention is explained using FIG. 7.

In a semiconductor relating to the fourth embodiment, an insulation film 24 is provided on the p-type silicon substrate 1, and the NMOS transistor 20 and the PMOS transistor 21, which have the same structures as those in the second embodiment shown in FIG. 5, are formed on the insulation film 24. In this embodiment, the work function of the p-type polycrystalline germanium film 3 is also brought close to the intrinsic mid gap energy of silicon. Accordingly, no difference arises as to the concentration of the impurities doped in the channel parts of the NMOS and the PMOS, therefore, a well-balanced CMOS characteristic is obtained.

MOSFET, generally referred to as Silicon on Insulator (SOI) MOSFET, is a device structure favorable for speeding up and lowering electric power consumption. For the insulation film 24, an embedded oxide (silicon dioxide) is often used, and for an embedding technique, techniques of implanting an oxygen ion and of bonding a wafer, on which a thermal oxide is formed, on another wafer, etc. are generally adopted. In this MOSFET case, as a silicon film (SOI film) to be a channel part is formed with a thin film, in order to maintain a threshold value equivalent to a bulk MOSFET, impurities of higher concentration should be doped into such thin film. This may cause the deterioration of carrier mobility. Therefore, compensating this deterioration by controlling the work function in accordance with the present invention, and suppressing the concentration of the impurities to be doped into the channel will be highly effective means for improving carrier mobility.

According to the present invention, as the work function of a gate electrode can be well-controllably brought close to the intrinsic mid gap energy of silicon, it is possible, whether an NMOS transistor or PMOS transistor, to lower the concentration of impurities in a channel. Therefore, the deterioration of the carrier mobility can be prevented and a MOSFET having a high current driving ability can be provided.

What is claimed is:

1. A semiconductor device, comprising:

a silicon substrate, a gate insulation film on the silicon substrate, a germanium film on the gate insulation film, a polysilicon film on the germanium film, and a transition metal nitride in direct contact with the polysilicon film, wherein p-type impurities are doped into the germanium film, and a range of concentration of the p-type impurities is about $10^{17}$ to $10^{20}$ cm$^{-3}$.

2. The semiconductor device according to claim 1, wherein the germanium film includes at least one of a single-crystalline germanium film, a polycrystalline germanium film and an amorphous germanium film.

3. A semiconductor device, comprising:

a substrate;

an insulation film on the substrate;

a silicon film on the insulation fil;

a gate insulation film on the silicon film;

a germanium film on the gate insulation film;

a polysilicon film on the germanium film; and a transition metal nitride in direct contact with the polysilicon film, wherein p-type impurities are doped into the germanium film, and a range of concentration of the p-type impurities is about $10^{17}$ to $10^{20}$ cm$^{-3}$.

4. The semiconductor device according to claim 3, wherein the germanium film includes at least one of a single-crystalline germanium film, a polycrystalline germanium and an amorphous germanium film.

5. The semiconductor device according to claim 1, wherein p-type impurities are doped into a channel region, and a range of concentration of the P-type impurities is $10^{17}$ to $10^{20}$ cm$^{-3}$, and wherein a resistance of the substrate is 14 to 22 Ω/cm.

* * * * *